US012712000B2

(12) United States Patent
Frans

(10) Patent No.: US 12,712,000 B2
(45) Date of Patent: Aug. 18, 2026

(54) MEMORY BANDWIDTH AGGREGATION USING SIMULTANEOUS ACCESS OF STACKED SEMICONDUCTOR MEMORY DIE

(71) Applicant: Rambus Inc., San Jose, CA (US)

(72) Inventor: Yohan Frans, Palo Alto, CA (US)

(73) Assignee: Rambus Inc., San Jose, CA (US)

( * ) Notice: Subject to any disclaimer, the term of this patent is extended or adjusted under 35 U.S.C. 154(b) by 132 days.

(21) Appl. No.: 18/919,041

(22) Filed: Oct. 17, 2024

(65) Prior Publication Data

US 2025/0087252 A1 Mar. 13, 2025

Related U.S. Application Data

(63) Continuation of application No. 18/195,860, filed on May 10, 2023, now Pat. No. 12,131,796, which is a
(Continued)

(51) Int. Cl.
*G11C 7/10* (2006.01)
*G11C 5/02* (2006.01)
(Continued)

(52) U.S. Cl.
CPC ................. *G11C 7/10* (2013.01); *G11C 5/02* (2013.01); *G11C 5/063* (2013.01); *G11C 7/22* (2013.01);
(Continued)

(58) Field of Classification Search
CPC .. G11C 7/10; G11C 5/02; G11C 5/063; G11C 7/22; G11C 5/025; H10W 70/63;
(Continued)

(56) References Cited

U.S. PATENT DOCUMENTS 7,764,564 B2 7/2010 Saito et al.
8,031,505 B2 10/2011 Kang et al.
(Continued)

OTHER PUBLICATIONS

Bae et al., "A 1.2V 30nm 1.6Gb/s/pin 4Gb LPDDR3 SDRAM with Input Skew Calibration and Enhanced Control Scheme," ISSCC 2012, Session 2, 2012 IEEE International Solid-State Circuits Conference, pp. 44-46, Feb. 20, 2012. 3 pages.
(Continued)

*Primary Examiner* — Xiaochun L Chen

(74) *Attorney, Agent, or Firm* — Lance Kreisman; Peninsula Patent Group

(57) ABSTRACT

A packaged semiconductor device includes a data pin, a first memory die, and a second memory die stacked with the first memory die. The first memory die includes a first data interface coupled to the data pin and a first memory core having a plurality of banks. The second memory die includes a second memory core having a plurality of banks. A respective bank of the first memory core and a respective bank of the second memory core perform parallel row access operations in response to a first command signal and parallel column access operations in response to a second command signal. The first data interface of the first die provides aggregated data from the parallel column access operations in the first and second die to the data pin.

20 Claims, 11 Drawing Sheets

Related U.S. Application Data continuation of application No. 17/135,174, filed on Dec. 28, 2020, now Pat. No. 11,651,801, which is a continuation of application No. 16/653,252, filed on Oct. 15, 2019, now Pat. No. 10,885,949, which is a continuation of application No. 15/907,212, filed on Feb. 27, 2018, now Pat. No. 10,453,500, which is a continuation of application No. 14/954,976, filed on Nov. 30, 2015, now Pat. No. 9,916,877, which is a continuation of application No. 13/908,973, filed on Jun. 3, 2013, now Pat. No. 9,230,609.

(60) Provisional application No. 61/655,950, filed on Jun. 5, 2012.

(51) Int. Cl.

| | |
|---|---|
| ***G11C 5/06*** | (2006.01) |
| ***G11C 7/22*** | (2006.01) |
| *H10W 70/63* | (2026.01) |
| *H10W 70/68* | (2026.01) |
| *H10W 72/00* | (2026.01) |
| *H10W 72/20* | (2026.01) |
| *H10W 90/00* | (2026.01) |
| *H10W 90/26* | (2026.01) |

(52) U.S. Cl.

CPC ............ *G11C 5/025* (2013.01); *H10W 70/63* (2026.01); *H10W 70/681* (2026.01); *H10W 72/07254* (2026.01); *H10W 72/247* (2026.01); *H10W 72/879* (2026.01); *H10W 90/00* (2026.01); *H10W 90/26* (2026.01); *H10W 90/722* (2026.01); *H10W 90/724* (2026.01); *H10W 90/754* (2026.01)

(58) Field of Classification Search

CPC ......... H10W 70/681; H10W 72/07254; H10W 72/247; H10W 72/879; H10W 90/00; H10W 90/26; H10W 90/722; H10W 90/724; H10W 90/754

See application file for complete search history.

(56) References Cited

U.S. PATENT DOCUMENTS

| | | | | |
|---|---|---|---|---|
| 8,076,766 | B2 | 12/2011 | Ikeda et al. | |
| 2004/0257847 | A1 | 12/2004 | Matsui et al. | |
| 2006/0039227 | A1 * | 2/2006 | Lai .......................... | G11C 8/12 365/220 |
| 2006/0273455 | A1 | 12/2006 | Williams et al. | |
| 2009/0161475 | A1 | 6/2009 | Kim et al. | |
| 2010/0020583 | A1 | 1/2010 | Kang et al. | |
| 2010/0232201 | A1 | 9/2010 | Ikeda et al. | |
| 2011/0246746 | A1 | 10/2011 | Keeth et al. | |
| 2012/0134193 | A1 | 5/2012 | Ide | |
| 2013/0083611 | A1 | 4/2013 | Ware et al. | |
| 2013/0145233 | A1 | 6/2013 | Nakano et al. | |

OTHER PUBLICATIONS

Fick et al., "Centip3De: A 3930DMIPS/W Configurable Near-Threshold 3D Stacked System with 64 ARM Cortex-M3 Cores," ISSCC 2012, Session 10, 2012 IEEE International Solid-State Circuits Conference, pp. 190-192, Feb. 21, 2012. 3 pages.

Kang et al., "8Gb 3D DDR3 DRAM Using Through-Silicon-Via Technology," ISSCC 2009, Session7, 2009 IEEE International Solid-State Circuits Conference, pp. 130-132, Feb. 10, 2009. 3 pages.

Kim et al., "3D-MAPS: 3D Massively Parallel Processor with Stacked Memory," ISSCC 2012, Session 10, 2012 IEEE International Solid-State Circuits Conference, pp. 188-190, Feb. 21, 2012. 3 pages.

Koo et al., "A 1.2V 38nm 2.4Gb/s/pin 2Gb DDR4 SDRAM with Bank Group and x4 Half-Page Architecture," ISSCC 2012, Session 2, 2012 IEEE International Solid-State Circuits Conference, pp. 40-41, Feb. 20, 2012. 2 pages.

Lee et al., "A 283.2mW 800Mb/s/pin DLL-Based Data Self-Aligner for Through-Silicon Via (TSV) Interface," ISSCC 2012, Session 2, 2012 IEEE International Solid-State Circuits Conference, pp. 48-50, Feb. 20, 2012. 3 pages.

Lim et al., "A 1.2V 23nm 6F2 4Gb DDR3 SDRAM with Local-Bitline Sense Amplifier, Hybrid LIO Sense Amplifier and Dummy-Less Array Architecture," ISSCC 2012, Session 2, 2012 IEEE International Solid-State Circuits Conference, pp. 42-44, Feb. 20, 2012. 3 pages.

Sohn et al., "A1.2V 30nm 3.2Gb/s/pin 4Gb DDR4 SDRAM with Dual-Error Detection and PVT-Tolerant Data-Fetch Scheme," ISSCC 2012, Session 2, 2012 IEEE International Solid-State Circuits Conterence, pp. 38-40, Feb. 20, 2012. 3 pages.

* cited by examiner

MEMORY BANDWIDTH AGGREGATION USING SIMULTANEOUS ACCESS OF STACKED SEMICONDUCTOR MEMORY DIE

RELATED APPLICATIONS

This application is a Continuation of U.S. application Ser. No. 18/195,860, entitled "MEMORY BANDWIDTH AGGREGATION USING SIMULTANEOUS ACCESS OF STACKED SEMICONDUCTOR MEMORY DIE", filed May 10, 2023, which is a Continuation of U.S. application Ser. No. 17/135,174, entitled "MEMORY BANDWIDTH AGGREGATION USING SIMULTANEOUS ACCESS OF STACKED SEMICONDUCTOR MEMORY DIE", filed Dec. 28, 2020, now U.S. Pat. No. 11,651,801, which is a Continuation of U.S. application Ser. No. 16/653,252, entitled "MEMORY BANDWIDTH AGGREGATION USING SIMULTANEOUS ACCESS OF STACKED SEMICONDUCTOR MEMORY DIE", filed Oct. 15, 2019, now U.S. Pat. No. 10,885,949, which is a Continuation of U.S. application Ser. No. 15/907,212, entitled "MEMORY BANDWIDTH AGGREGATION USING SIMULTANEOUS ACCESS OF STACKED SEMICONDUCTOR MEMORY DIE", filed Feb. 27, 2018, now U.S. Pat. No. 10,453,500, which is a Continuation of U.S. application Ser. No. 14/954,976, entitled "MEMORY BANDWIDTH AGGREGATION USING SIMULTANEOUS ACCESS OF STACKED SEMICONDUCTOR MEMORY DIE", filed Nov. 30, 2015, now U.S. Pat. No. 9,916,877, which is a Continuation of U.S. application Ser. No. 13/908,973, entitled "MEMORY BANDWIDTH AGGREGATION USING SIMULTANEOUS ACCESS OF STACKED SEMICONDUCTOR MEMORY DIE", filed Jun. 3, 2013, now U.S. Pat. No. 9,230,609, which claims the benefit of priority under 35 U.S.C. 119(e) to Provisional Application Ser. No. 61/655,950, filed Jun. 5, 2012, entitled MEMORY BANDWIDTH AGGREGATION USING SIMULTANEOUS ACCESS OF STACKED SEMICONDUCTOR MEMORY DIE, all of which are incorporated herein by reference in their entireties for all purposes.

TECHNICAL FIELD

The present embodiments relate generally to semiconductor memories, and specifically to semiconductor memory die arranged in a stacked configuration in a package.

BACKGROUND

Semiconductor die can be stacked in a package and coupled using through-die vias (e.g., through-silicon vias). For example, semiconductor memory die can be stacked to increase the amount of memory provided by a packaged semiconductor memory device. However, using through-die vias in die stacks presents significant engineering challenges. For example, through-die vias consume die area; their use thus increases die size.

Accordingly, there is a need for efficient schemes for using through-die vias to couple stacked memory die.

BRIEF DESCRIPTION OF THE DRAWINGS

The present embodiments are illustrated by way of example and are not intended to be limited by the figures of the accompanying drawings.

Like reference numerals refer to corresponding parts throughout the drawings and specification.

DETAILED DESCRIPTION

Figure 1A:
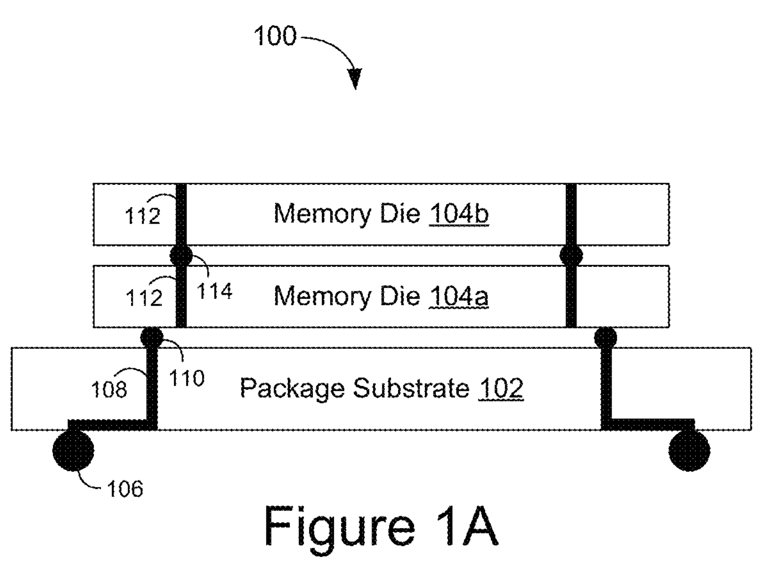
FIGS. 1A-1C are schematic cross-sectional views of packaged semiconductor memory devices with stacked memory die in accordance with some embodiments.

Embodiments are disclosed in which data accessed from multiple memory die arranged in a stacked configuration is aggregated.

In some embodiments, a packaged semiconductor memory device includes a data pin, a first memory die, and a second memory die. The first memory die includes a first data interface coupled to the data pin and a first memory core having a plurality of banks. The second memory die is stacked with the first memory die and includes a second memory core having a plurality of banks. A respective bank of the first memory core and a respective bank of the second memory core are configured to perform memory access operations in parallel, and the first data interface is configured to provide aggregated data from the parallel memory access operations. For example, the respective banks of the first and second memory cores are configured to perform parallel row access operations in response to a first command signal and parallel column access operations in response to a second command signal. The first data interface is configured to provide aggregated data from the parallel column access operations to the data pin.

In some embodiments, a method of operating a packaged semiconductor memory device is performed for a packaged semiconductor memory device that includes a data pin, a first memory die having a first memory core, and a second memory die stacked with the first memory die and having a second memory core. The method includes performing memory access operations in parallel in a bank of the first memory core and a bank of the second memory core, aggregating data from the parallel memory access operations, and transmitting the aggregated data from the data pin. For example, the method includes performing parallel row access operations in the bank of the first memory core and the bank of the second memory core, performing parallel column access operations in the bank of the first memory core and the bank of the second memory core, aggregating data from the parallel column access operations, and transmitting the aggregated data from the data pin.

In some embodiments, an electronic system includes a semiconductor memory controller and a packaged semiconductor memory device. The packaged semiconductor memory device includes a first memory die and a second memory die stacked with the second memory die. The first and second memory die include respective first and second memory cores, each having a plurality of banks. A respective bank of the first memory core and a respective bank of the second memory core are configured to perform memory access operations in parallel. The first memory die further includes a data interface configured to transmit aggregated data from the parallel column access operations to the memory controller. For example, the respective banks of the first and second memory cores are configured to perform row access operations in response to a first command signal and parallel column access operations in response to a second command signal, and the data interface of the first memory die is configured to transmit aggregated data from the parallel column access operations to the memory controller.

Reference will now be made in detail to various embodiments, examples of which are illustrated in the accompanying drawings. In the following detailed description, numerous specific details are set forth in order to provide a thorough understanding of the disclosure. However, some embodiments may be practiced without these specific details. In other instances, well-known methods, procedures, components, and circuits have not been described in detail so as not to unnecessarily obscure aspects of the embodiments.

FIG. 1A is a schematic cross-sectional view of a packaged semiconductor memory device 100 in accordance with some embodiments. In the device 100, two memory die 104*a* and 104*b* are stacked on top of a package substrate 102 (e.g., a printed circuit board). In some embodiments, the memory die 104*a* and 104*b* are dynamic random-access memory (DRAM) die. The memory die 104*a* and 104*b* include through-die vias 112 that couple circuitry in the die 104*a* to corresponding circuitry in the die 104*b*. When the die 104*a* and 104*b* are silicon-based, the through-die vias 112 are referred to as through-silicon vias (TSVs). The die 104*a* and 104*b* are connected by interconnects 114 (e.g., metallic bumps) that connect corresponding through-die vias 112 on the die 104*a* and 104*b*. Circuitry on the die 104*a* thus may transmit signals to corresponding circuitry on the die 104*b* through a through-die via 112 on the die 104*a*, an interconnect 114, and a corresponding through-die via 112 on the die 104*b*. Circuitry on the die 104*b* may transmit signals to circuitry on the die 104*a* in a similar manner.

In some embodiments, the bottom die 104*a* is coupled to the package substrate 102 (e.g., in a flip-chip configuration) by interconnects (e.g., metallic bumps) 110. Attached to the package substrate 102 are pins 106, including signal pins for receiving and transmitting signals as well as power and ground pins. (The term pin as used herein includes pins, balls, lands, bumps, micro-bumps, and any other contacts suitable for electrically connecting the packaged device 100 to a circuit board or other underlying substrate). Examples of signal pins 106 include data pins for transmitting and/or receiving data, data strobe pins for transmitting and/or receiving data strobe signals, command-and-address (C/A) pins for receiving commands and associated memory addresses, and clock pins for receiving clock signals. A respective data pin may be bi-directional or uni-directional.

A respective signal pin 106 is coupled to a respective interconnect 110, and thus to the bottom die 104*a*, by traces and vias 108 in the package substrate 102. The respective signal pin 106 may further be coupled to the top die 104*b* by through-die vias 112 and an interconnect 114.

Figure 1B:
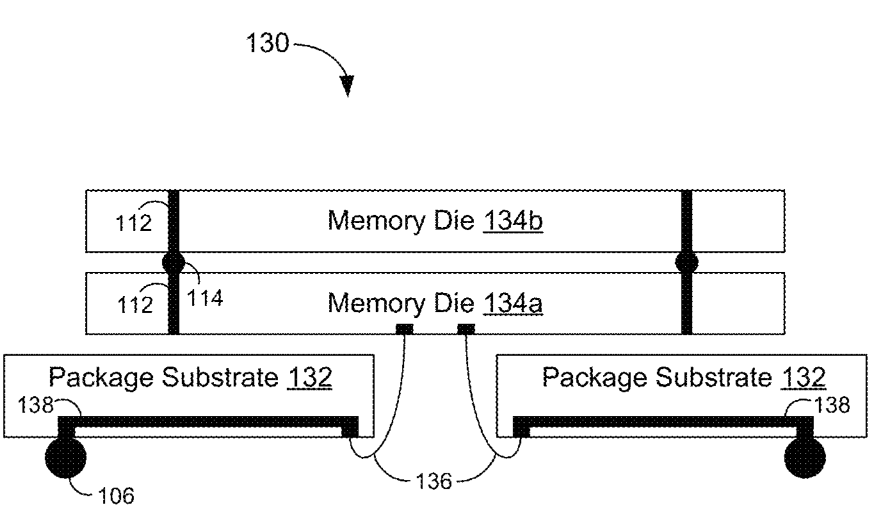

In some embodiments, the bottom die in a stack also may be electrically coupled to the substrate using bond wires. FIG. 1B is a schematic cross-sectional view of a packaged semiconductor memory device 130 in which two memory die 134*a* and 134*b* are stacked on a package substrate 132. The bottom die 134*a* is electrically coupled to the substrate 132 by bond wires 136 that couple respective bond pads on the bottom die 134*a* to corresponding lands on the substrate 132; these corresponding lands are coupled in turn to respective pins 106 (e.g., by respective traces and vias 138 in the substrate 132). The top die 134*b* and bottom die 134*a* are coupled by through-die vias 112 and interconnects 114, as described for FIG. 1A.

Figure 1C:
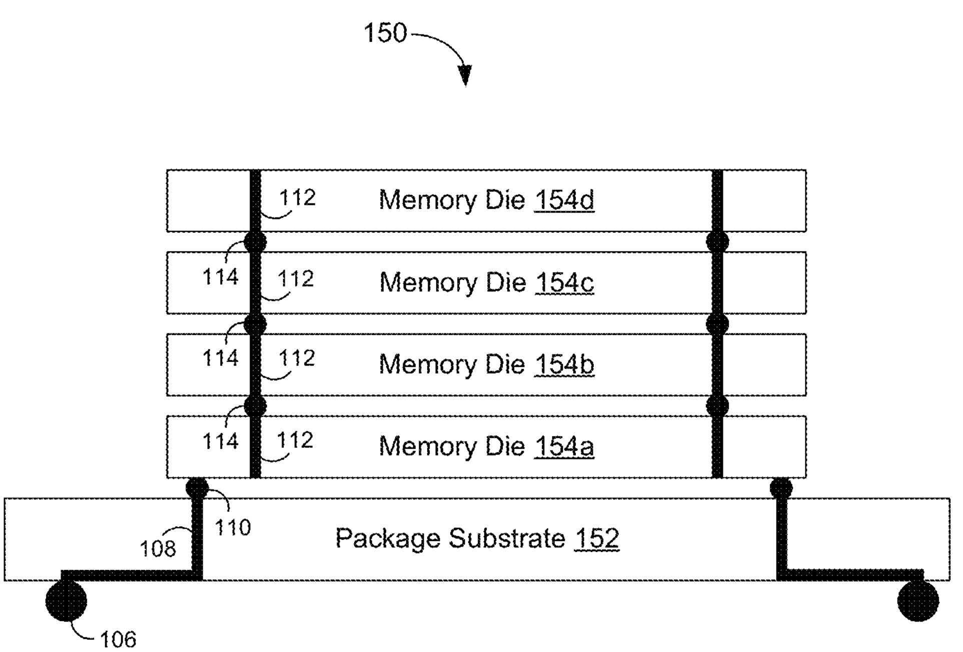

FIGS. 1A and 1B illustrate examples of packaged semiconductor devices 100 and 130 with two stacked die. In some embodiments, three or more die may be stacked in a package. FIG. 1C is a schematic cross-sectional view of a packaged semiconductor memory device 150 with four stacked die 154*a-d* in accordance with some embodiments. The four stacked die 154*a-d* are stacked on a package substrate 152. The four die 154*a-d* are connected by interconnects 114 (e.g., metallic bumps) that connect corresponding through-die vias 112 on the die 154*a-d*. Circuitry on a respective one of the die 154*a-d* thus may transmit signals to corresponding circuitry on the other three die through through-die vias 112 and corresponding interconnects 114.

In the example of FIG. 1C, the bottom die 154*a* is coupled to the package substrate 152 by interconnects 110, as described for the device 100 (FIG. 1A). In other examples, the bottom die may also or alternatively be coupled to the substrate 152 by bond wires (e.g., as shown for the device 130, FIG. 1B). The upper die 154*b-d* are electrically coupled to the substrate 152 by through-die vias 112, interconnects 114, and interconnects 110.

In some embodiments, one of the memory die in a stacked die configuration (e.g., in the device 100, 130, or 150, FIGS. 1A-1C) is configured as a master die and the remaining memory die in the stack is/are configured as slave die. For example, the bottom die 104*a*, 134*a*, or 154*a* (FIGS. 1A-1C) is configured as the master die, and the other die is/are configured as a slave or slaves. (Alternatively, a die with another position in the stack is configured to be the master die.) Memory access instructions are provided to the master die; in response, memory access operations are performed in parallel in both the master and slave die. For example, a bank in the memory core of each die is selected and memory access operations are performed in the selected banks. Accessed data from the slave die are provided to the master die, which aggregates (e.g., interleaves) the accessed data with its own accessed data. In some embodiments, each slave die serializes its accessed data and provides the serialized data to the master die. The master die serializes its own accessed data and aggregates the master and slave serialized data into a single serialized data stream.

Figure 2A:
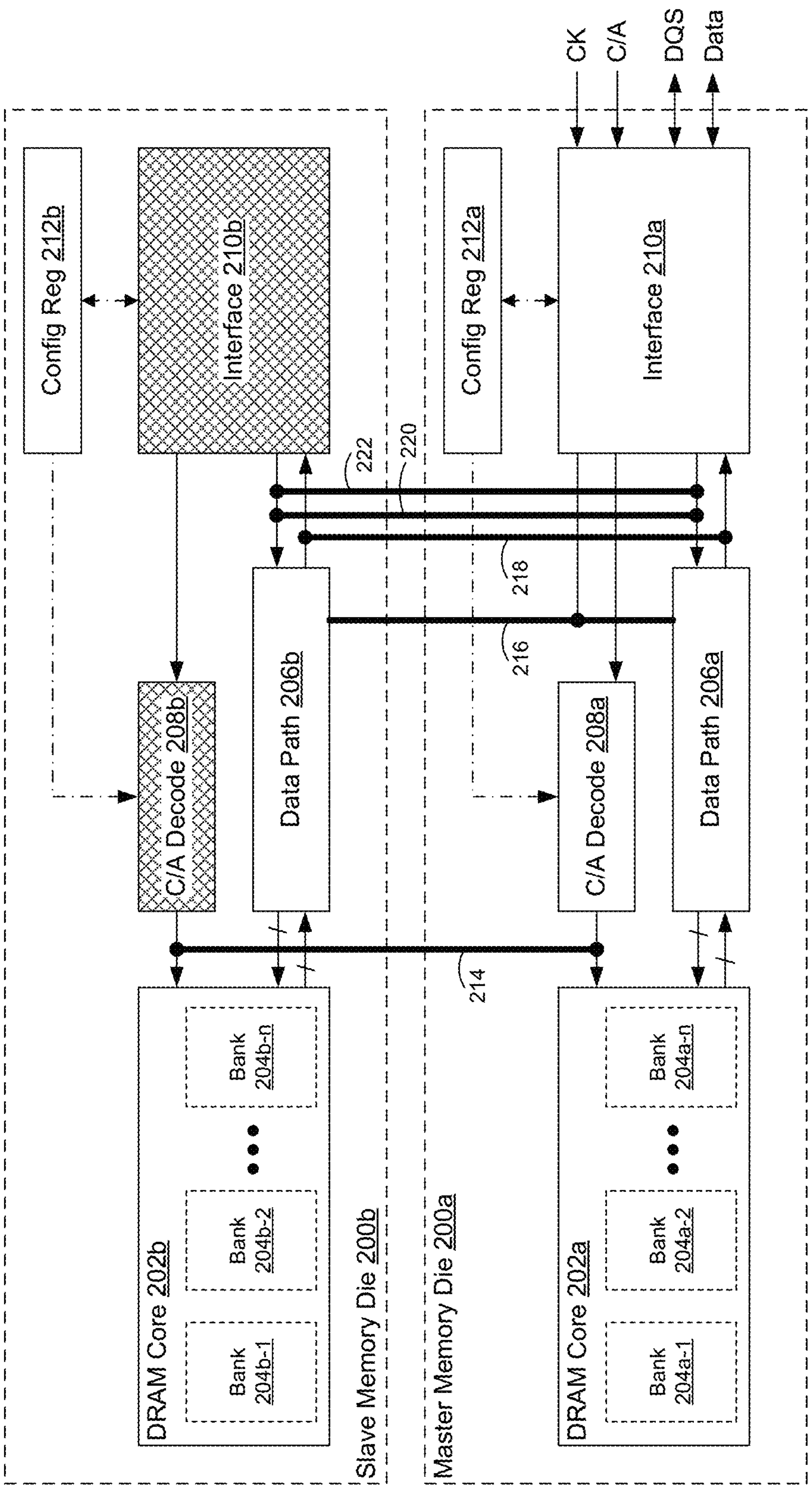
FIGS. 2A-2B are schematic block diagrams of a master memory die stacked with a slave memory die in accordance with some embodiments.

FIG. 2A is a schematic block diagram of a master memory die 200*a* stacked with a slave memory die 200*b* in a package in accordance with some embodiments. The memory die 200*a* and 200*b* are DRAM die in this example. In some embodiments, the memory die 200*a* and 200*b* are examples of the die 104*a* and 104*b* (FIG. 1A) or 134*a* and 134*b* (FIG. 1B).

The master die 200*a* includes a DRAM core 202*a* with a plurality of memory banks 204*a*-1 through 204*a-n*, where n is an integer greater than one. Each bank 204*a* includes an array of memory cells arranged in rows and columns. The master die 200*a* also includes an interface 210*a* that functions as a data interface to receive and transmit data, a command-and-address (C/A) interface to receive commands (e.g., memory access commands, such as row access commands and column access commands) and their associated addresses, and a clock (CK) interface to receive an external clock signal. In some embodiments, the interface 210*a* generates an internal clock signal based on the external clock signal (e.g., using a delay-locked loop (DLL) or phase-locked loop (PLL)). The interface 210*a* thus is coupled to one or more data pins, one or more C/A pins, and a clock pin. In some embodiments, the interface 210*a* is also coupled to a data strobe (DQS) pin.

Coupled between the interface 210*a* and the DRAM core 202*a* is a data path 206*a*. For write operations, the interface 210*a* receives serialized write data; the data path 206*a* deserializes a portion of the write data and provides the deserialized portion to the core 202*a*. For read operations, the data path 206*a* serializes read data fetched from the core 202*a* and provides the serialized read data to the interface 210*a*. Also coupled between the interface 210*a* and the core 202*a* is C/A decode circuitry 208*a*, also referred to as C/A decoder 208*a*, which decodes C/A signals from the interface 210*a* and provides the decoded C/A commands and associated addresses to the core 202*a*.

The master memory die 200*a* also includes a configuration register 212*a*. The memory die 200*a* can be configured as the master die by storing a corresponding value in the configuration register 212*a* (e.g., in response to a command provided to the interface 210*a*). The configuration register 212*a* is coupled to the interface 210*a* and C/A decoder 208*a* and provides an enable signal that activates both circuits when it stores the value indicating that the die 200*a* is the master die.

The slave memory die 200*b* similarly includes a DRAM core 202*b* with banks 204*b*-1 through 204*b-n*, interface 210*b*, data path 206*b*, C/A decoder 208*b*, and configuration register 212*b*, all situated as described for the corresponding elements of the master memory die 200*a*. The die 200*b* is configured as the slave die by storing a corresponding value in the configuration register 212*b*. When the configuration register 212*b* stores this value, it de-asserts the enable signal for the decoder 208*b* and interface 210*b* and thus turns off the decoder 208*b* and interface 210*b* (as indicated by the cross-hatch patterns of the decoder 208*b* and interface 210*b* in FIG. 2A).

The configuration registers 212*a* and 212*b* thus allow a given die 200 to be configured as either the master die or a slave die, depending on its position in the stack. Typically, the interface 210 of a single die 200 in a stack is connected to the corresponding data, DQS, C/A, and/or clock pins. (In the example of FIG. 2A, the interface 210*a* is connected to the data, DQS, C/A, and clock pins.) That die is configured as the master die and the other die are configured as the slave die, by writing appropriate values to the configuration registers 212.

The master die 200*a* and slave die 200*b* are coupled by a plurality of through-die vias (e.g., TSVs). A through-die via 214 is coupled between outputs of the C/A decoders 208*a* and 208*b*. The through-die via 214 provides decoded C/A commands from the C/A decoder 208*a* of the master die 200*a* to the core 202*b* of the slave die 200*b*. The C/A decoder 208*a* thus is coupled to the cores 202*a* and 202*b* of both die 200*a* and 200*b*. Another through-die via 218 is coupled between the read outputs of the data paths 206*a* and 206*b* and provides read data from the read output of the data path 206*b* to the read input of the interface 210*a*. Still another through-die via 216 is coupled to clock outputs of interfaces 210*a* and 210*b* and coupled between data paths 206*a* and 206*b*. The through-die via 216 provides a clock signal from the interface 210*a* to the data path 206*b*. Additional through-die vias 220 and 222 are coupled between write outputs of the interfaces 210*a* and 210*b*, and thus also between write inputs of the data paths 206*a* and 206*b*, and provide write data and an associated write data strobe signal (DQS) from the interface 210*a* to the data path 206*b*. Each of the through-die vias 214, 216, 218, 220, and 222 as shown schematically in FIG. 2A corresponds physically to a through-die via 112 (FIGS. 1A-1B) in each of the two die 200*a* and 200*b*, as connected by an interconnect 114 (FIGS. 1A-1B).

Figure 3A:
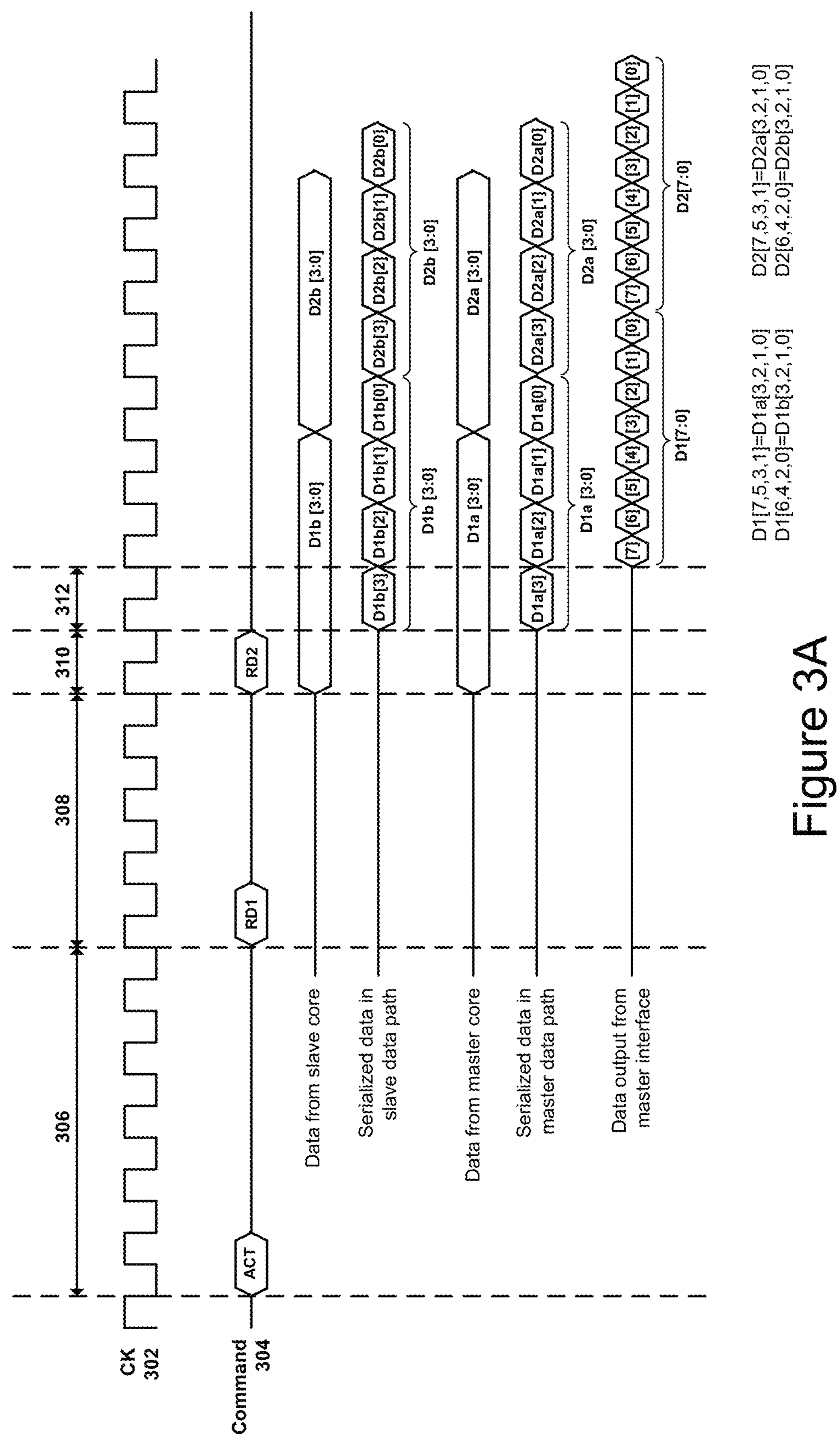
FIG. 3A is a timing diagram illustrating timing of read operations for two stacked memory die in accordance with some embodiments.

FIG. 3A is a timing diagram illustrating timing of read operations for the stacked die 200*a* and 200*b* in accordance with some embodiments. FIG. 3A shows a clock signal (CK) 302, command signals 304, and data signals at various locations in the die 200*a* and 200*b* during read operations. The interface 210*a* provides CK 302 to data path 206*a* and also to data path 206*b* using through-die via 216.

Figure 2B:
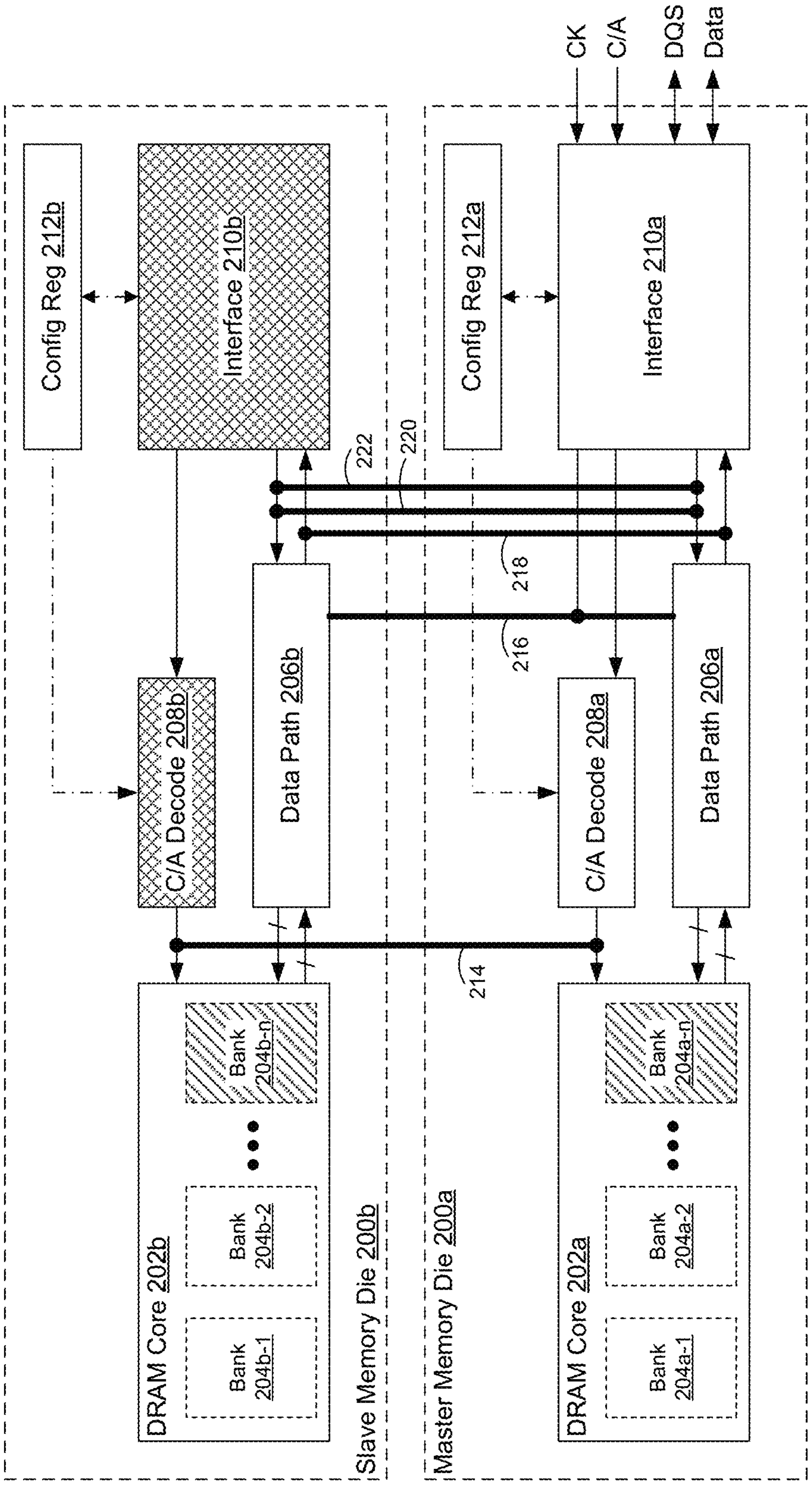

To read data from the cores 202*a* and 202*b*, a row access command signal (ACT) is provided to the C/A input of the interface 210*a*. The row access command may also be referred to as a page activation command or a bank activation command. No signal is provided to the interface 210*b*, which is disabled and is not connected to C/A pins. The interface 210*a* forwards the ACT signal to the C/A decoder 208*a*, which decodes the command (and its associated row address) and provides control signals corresponding to the decoded command to the core 202*a* and, by way of through-die via 214, the core 202*b*. The decoded ACT command specifies a row within a bank of each die 200*a* and 200*b*. The specified banks are activated in parallel in cores 202*a* and 202*b* during period 306. For example, FIG. 2B illustrates activation of banks 204*a-n* and 204*b-n* in parallel (as indicated by the fill pattern) in response to the ACT signal. Specifically, the specified row in each of banks 204*a-n* and 204*b-n* is activated. The banks 204*a-n* and 204*b-n* thus logically form a single bank spanning the two die 200*a* and 200*b*.

A first column access command signal (RD1) is then provided to the C/A input of the interface 210*a*. The interface 210*a* forwards the RD1 signal to the C/A decoder 208*a*, which decodes the command (and its associated column address) and provides control signals corresponding to the decoded command to the core 202*a* and, by way of through-die via 214, the core 202*b*. The decoded RD1 command specifies columns sharing a first column address in the banks 204*a-n* and 204*b-n*. In response to the decoded RD1 command, data is fetched from memory cells in the activated row and the specified columns during period 308. Each bank 204*a-n* and 204*b-n* thus provides parallel data to its respective data path 206*a* or 206*b* in response to RD1: bank 202*a-n* provides parallel data D1*a*[3:0] to data path 206*a* and bank 204*b-n* provides parallel data D1*b*[3:0] to data path 206*b*. In the example of FIG. 3A, the first column address specifies four physical columns in each bank and the parallel data from each bank is four bits wide (i.e., is ×4 or "by four"). Other data widths (e.g., ×2 or ×8) are possible in other examples.

Data path 206*a* serializes data D1*a*[3:0] into a sequence of bits D1*a*[3], D1*a*[2], D1*a*[1], and D1*a*[0]. Data path 206-*b* serializes data D1*b*[3:0] into a sequence of bits D1*b*[3], D1*b*[2], D1*b*[1], and D1*b*[0]. (Other orders are possible). This serialization begins during period 310. The data paths 206*a* and 206*b* provide the serialized data to the interface 210*a* in a manner such that the serialized data from each data path 206*a* and 206*b* are aggregated into a serialized stream of bits D1[7:0]. This aggregation begins during period 312. In the example of FIG. 3A, data bits from data paths 206*a* and 206*b* are interleaved: D1[7] is D1*a*[3], D1[6] is D1*b*[3], and so on. (The order of alternation may be reversed.) Serialized data from the data path 206*b* is provided to the interface 210*a* using through-die via 218. The interface 210*a* outputs the aggregated serialized bits D1[7:0] to a data pin (e.g., a pin 106, FIGS. 1A-1B). In the example of FIG. 3A, D1[7:0] are output at double data rate (DDR): bits are transmitted on both the rising and falling edges of CK 302.

While data for RD1 is being serialized, a second column access command RD2 is provided to the C/A input of the interface 210*a*. RD2 is processed in the manner described above for RD1. In response, bank 202*a*-*n* provides parallel data D2*a*[3:0] to data path 206*a* and bank 204*b*-*n* provides parallel data D2*b*[3:0] to data path 206*b*. Data path 206*a* serializes data D2*a*[3:0] into a sequence of bits D2*a*[3], D2*a*[2], D2*a*[1], and D2*a*[0]. Data path 206-*b* serializes data D2*b*[3:0] into a sequence of bits D2*b*[3], D2*b*[2], D2*b*[1], and D2*b*[0]. The data paths 206*a* and 206*b* provide the serialized data to interface 210*a* in a manner such that the serialized data from each data path 206*a* and 206*b* are interleaved, and thus aggregated, into a serialized stream of bits D2[7:0]. Serialized data from the data path 206*b* is provided to interface 210*a* using through-die via 218. The interface 210*a* outputs the aggregated serialized bits D2[7:0] at double data rate. Commands RD1 and RD2 are timed such that interface 210*a* outputs D2[7:0] immediately after outputting D1[7:0].

Additional column access commands may be provided at specified intervals (e.g., intervals of four CK 302 cycles) to read data in additional groups of columns of the row accessed in response to the ACT command. The timing for these additional column access commands corresponds to the timing shown for RD1 and RD2 in FIG. 3A.

The row access operations and column access operations are performed substantially simultaneously in the die 200*a* and 200*b*, since they are performed in parallel. While substantially simultaneous, they may not be precisely simultaneous, due for example to process variations and delays in providing signals from the master die 200*a* to the slave die 200*b*.

Figure 3B:
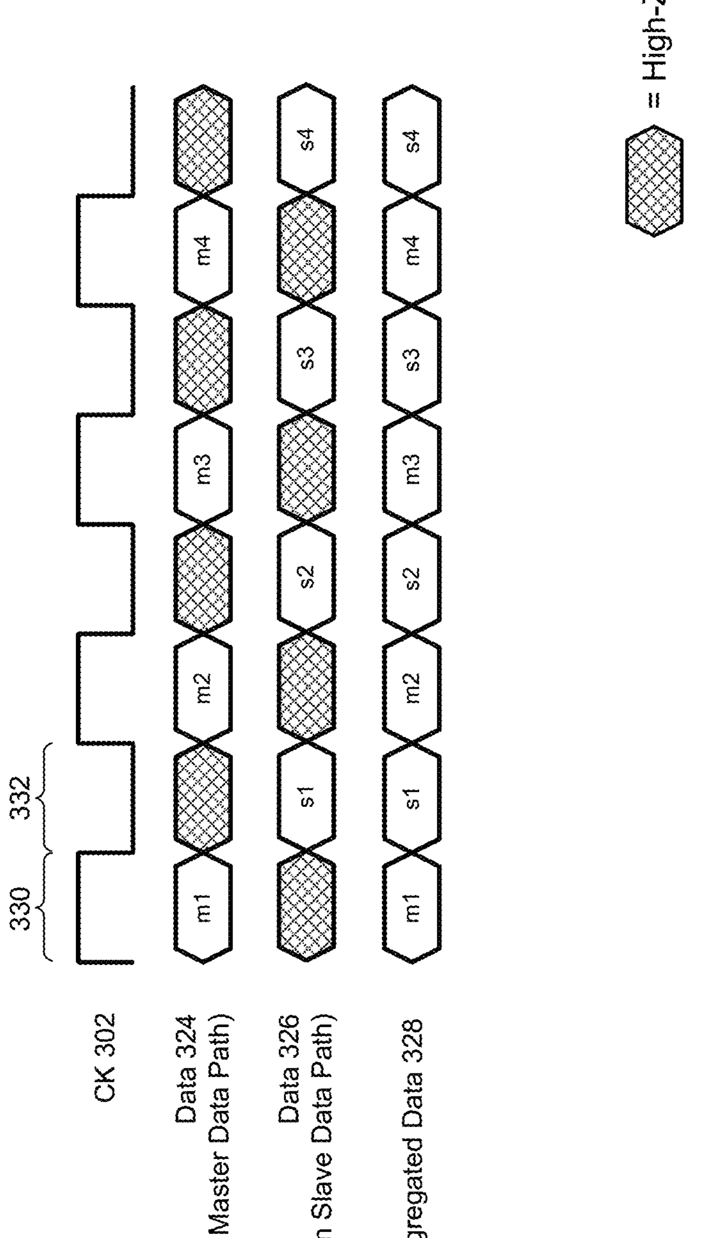
FIG. 3B is a timing diagram illustrating aggregation of data accessed from and serialized by a master die and a slave die in parallel in accordance with some embodiments.

FIG. 3B illustrates aggregation of data accessed from and serialized by master die 200*a* and slave die 200*b* in parallel in accordance with some embodiments. In response to a column access operation (e.g., RD1 or RD2, FIG. 3A), four bits m1, m2, m3, and m4 are fetched from a bank of the master core 202*a* and four bits s1, s2, s3, and s4 are fetched in parallel from a corresponding bank of the slave core 202*b*. These fetches are performed in parallel. The master data path 206*a* serializes the first four bits into a sequence m1, m2, m3, and m4. The slave data path 206*b* serializes the second four bits into a sequence s1, s2, s3, and s4. This serialization by the master and slave data paths 206*a* and 206*b* is also performed in parallel. For four successive cycles of CK 302, the master data path 206*a* transmits data 324: a respective bit is transmitted to the interface 210*a* during a first portion 330 of the cycle and the transmitting output is tristated (i.e., put in a high-impedance or high-Z state) during a second portion 332 of the cycle. The first portion 330 begins on the rising edge of CK 302 and the second portion 332 begins on the falling edge of CK 302. Also during the four successive cycles, the slave data path 206*b* transmits data 326: a respective bit is transmitted to the interface 210*a* during the second portion 332 of the cycle and the transmitting output is tristated (i.e., put in a high-impedance or high-Z state) during the first portion 330 of the cycle. (Alternatively, the master data path 206*a* transmits during the second portion 332 and the slave data path 206*b* transmits during the first portion 330). The result is a double-date-rate aggregated data stream 328 with alternating bits m1, s1, and so on from the master core 202*a* and slave core 202*b*. The interface 210*a* transmits the aggregated data stream 328 (e.g., to a memory controller 602, FIG. 6) via a data pin.

While FIG. 3B illustrates aggregating data from the master die 200*a* and slave die 200*b* by interleaving bits from the respective die, other aggregation techniques are possible. For example, the master data path 206*a* may provide a burst of multiple (e.g., four) bits to the interface 210*a*, after which the slave data path 206*b* provides a corresponding burst of multiple bits to the interface 210*a* (or vice-versa). Also, when a die stack includes more than two die (e.g., includes four die 154*a*-*d*, FIG. 1C), data from each die may be aggregated, for example, by interleaving bits from each die (e.g., in round-robin) or by aggregating bursts of bits from successive die.

Figure 4A:
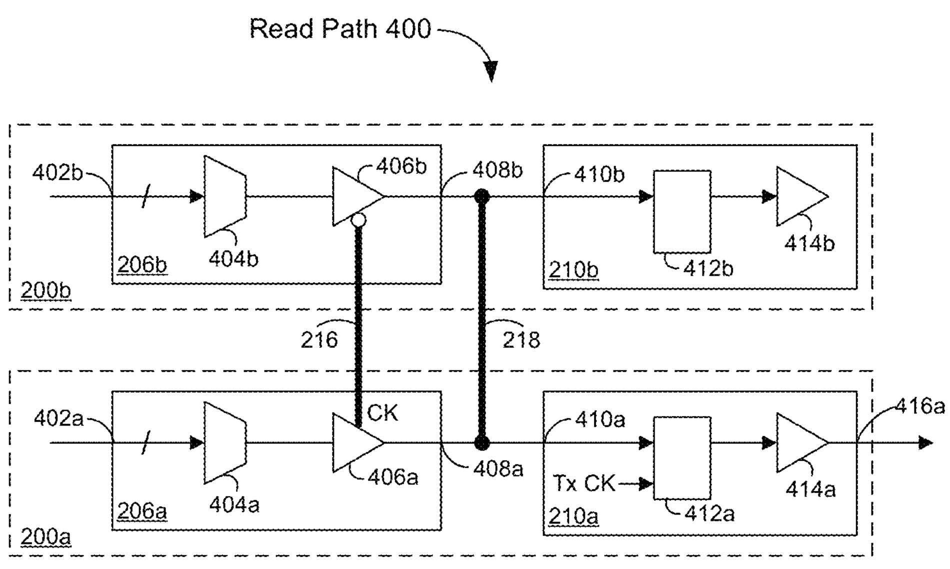
FIGS. 4A and 4B are schematic diagrams showing circuitry in a read path of two stacked memory die in accordance with some embodiments.

FIG. 4A illustrates circuitry in a read path 400 of the memory die 200*a* and 200*b* (FIGS. 2A-2B) in accordance with some embodiments. The data paths 206*a* and 206*b* include read inputs 402*a* and 402*b* that receive parallel data from cores 202*a* and 202*b*. Serializers 404*a* and 404*b* serialize the data (e.g., data D1*a*[3:0], D2*a*[3:0], D1*b*[3:0], and D2*b*[3:0], FIG. 3A). Tri-state buffers 406*a* and 406*b* transmit serialized bits via outputs 408*a* and 408*b* (and, for die 200*b*, using through-die via 218) to the interface 210*a* in an alternating manner, as shown for data sequences 324 and 326 (FIG. 3B), such that aggregated data sequence 328 (FIG. 3B) is received at input 410*a* of the interface 210*a*. (The sequence 328 is also received at the input 410*b* of the interface 210*b*, but the interface 210*b* is disabled.) The clock (CK) signal is used to enable/disable tri-state buffers 406*a* and 406*b*. The clock (CK) signal provided to tri-state buffer 406*b* (using through-die via 216) is inverted with respect to tri-state buffer 406*a*, to achieve the interleaved sequence 328.

The interfaces 210*a* and 210*b* may include double-data-rate retimers 412*a* and 412*b* coupled to buffers 414*a* and 414*b*. The double-data-rate retimer 412*a* receives the aggregated data sequence 328, retimes the sequence 328 using both rising and falling edges of a transmit clock (Tx CK), and provides the retimed sequence 328 to the buffer 414*a*, which drives the retimed sequence 328 onto an output 416*a* coupled to a data pin.

Figure 4B:
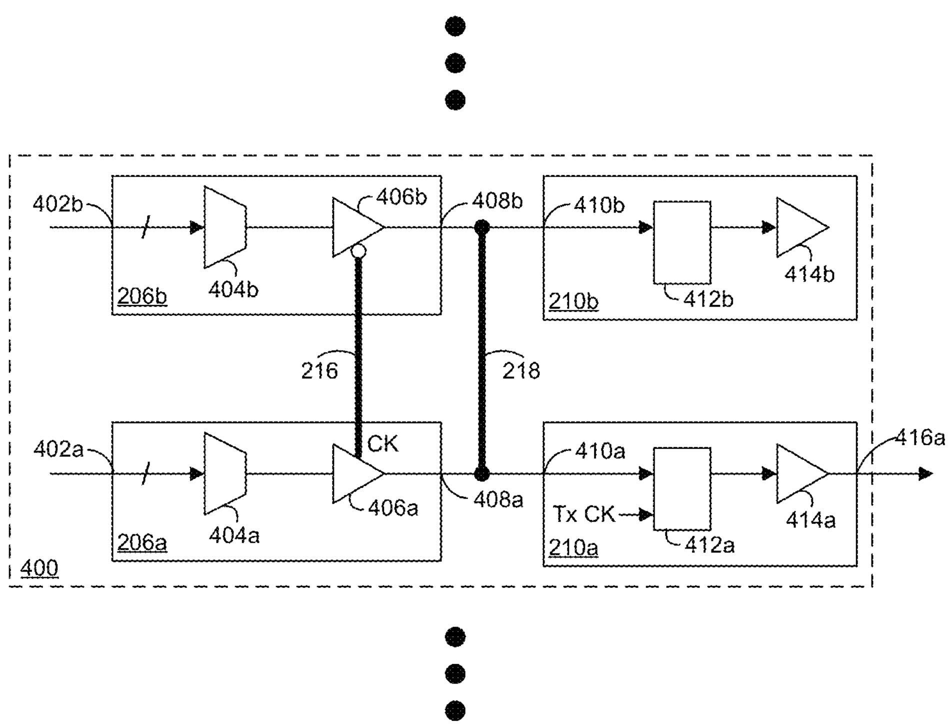

In some embodiments, the master die 200*a* and slave die 200*b* together include multiple instances of the read path 400, as shown in FIG. 4B. Each instance 400 is coupled to the cores 202*a* and 202*b* to receive data fetched from the cores 202*a* and 202*b* during column access operations. Each instance 400 is also coupled to a respective data pin (e.g., an output data pin or a bidirectional data pin) and transmits serialized data from column access operations via its respective data pin.

Figure 5A:
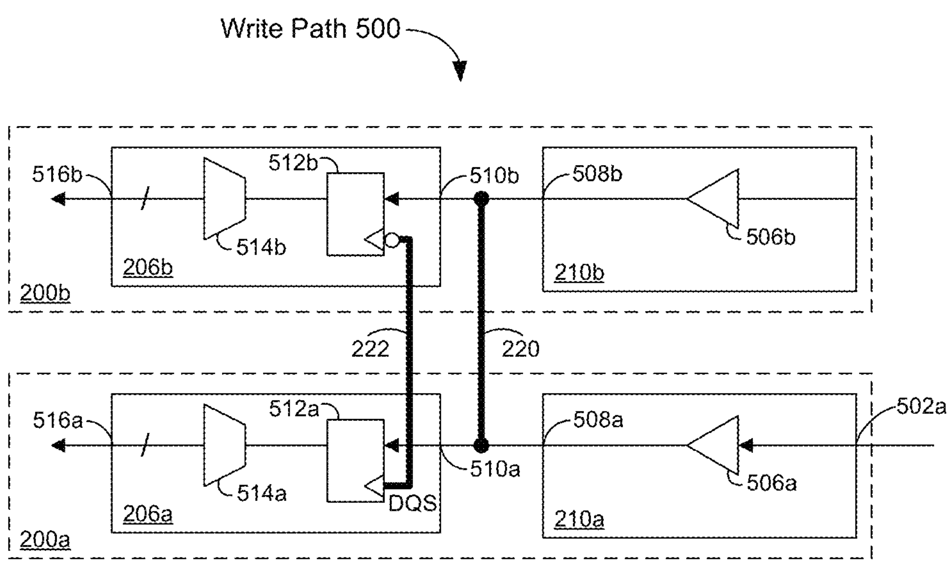
FIGS. 5A and 5B are schematic diagrams showing circuitry in a write path of two stacked memory die in accordance with some embodiments.

Attention is now directed to performing write operations in the master die 200*a* and slave die 200*b* of FIGS. 2A-2B. FIG. 5A illustrates circuitry in a write path 500 of the die 200*a* and 200*b* in accordance with some embodiments. Each interface 210*a* and 210*b* includes a buffer 506*a* and 506*b*. Each data path 206*a* and 206*b* includes a flip-flop 512*a* and 512*b* coupled to a deserializer 514*a* and 514*b*. During write operations, serial write data (e.g., from a memory controller 602, FIG. 6) is provided via a data pin (e.g., a pin 106, FIG. 1A-1B) to a write input 502*a* of the interface 210*a*. In some embodiments, the write data is received at a double data rate. The buffer 506*a* receives the serialized data and drives the serialized data onto a write output 508*a* of the interface 210*a*. The write output 508*a* is coupled to inputs 510*a* and 510*b* of the data paths 206*a* and 206*b*; these inputs are coupled in turn to flip-flops 512*a* and 512*b*. Through-die via 220 couples the write output 508*a* to the input 510*b*.

In some embodiments, a data strobe signal (DQS) accompanies the serialized write data. The interface 210*a* provides DQS to a through-die via 222 and thereby to the data path 206*b* as well as to the data path 206*a*. (The circuitry coupling the interface 210*a* to the through-die via 222 is not shown in FIG. 5A, for simplicity.) The DQS signal clocks the flip-flops 512*a* and 512*b*, with the DQS signal provided to the flip-flop 512*b* being inverted with respect to the flip-flop 512*a*. The flip-flop 512*a* clocks in data on the rising edge of DQS (and thus during a first portion of the cycle of the DQS signal) and the flip-flop 512*b* clock in data on the falling edge of DQS (and thus during a second portion of the cycle of the DQS signal). The flip-flops 512*a* and 512*b* thereby receive bits in an alternating manner (and also disregard bits in an alternating manner), with each one receiving half of the bits of the serial write data. (In other embodiments, a burst of bits is received by the data path 206*a*, after which a burst of bits is received by the data path 206*b*, or vice-versa).

The flip-flops 512*a* and 512*b* provide their data to deserializers 514*a* and 514*b*, each of which deserializes the bits clocked in by its respective flip-flop. The resulting parallel data is provided to the cores 202*a* and 202*b*, which write the data into a specified address in a specified bank 204. Data is thus written to a specified one of the banks 204*a*-1 through 204*a*-*n* (FIGS. 2A-2B) and to a specified one of the banks 204*b*-1 through 204*b*-*n* (FIGS. 2A-2B) in parallel.

Figure 5B:
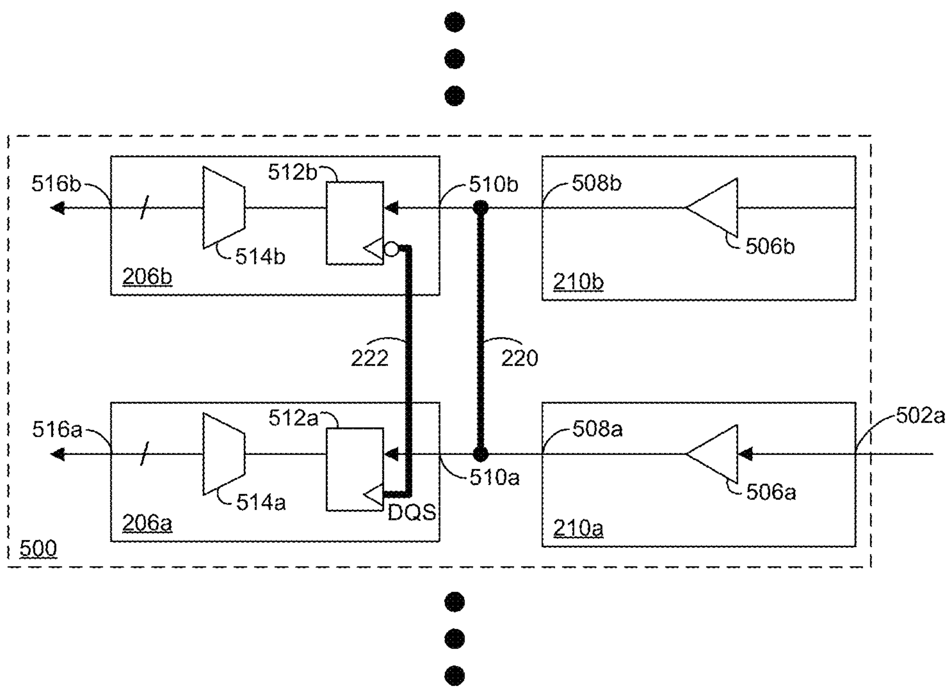

In some embodiments, the master die 200*a* and slave die 200*b* together include multiple instances of the write path 500, as shown in FIG. 5B. Each instance 500 is coupled to the cores 202*a* and 202*b* to provide data to cores 202*a* and 202*b* during write operations. Each instance 500 is also coupled to a respective data pin (e.g., an input data pin or a bidirectional data pin) and receives serialized data for write operations via its respective data pin.

Figure 6:
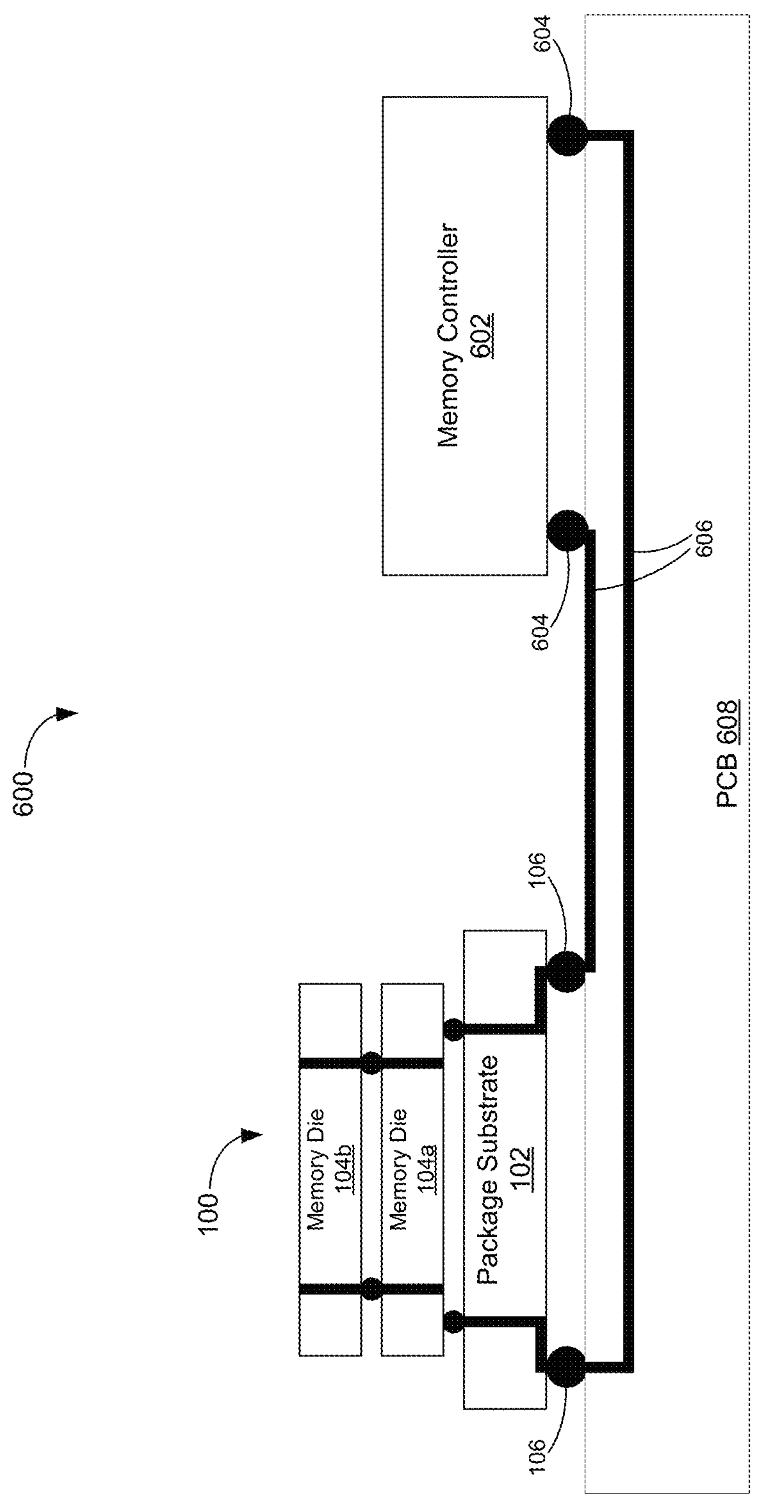
FIG. 6 is a cross-sectional block diagram of an electronic system that includes a memory controller and a packaged semiconductor memory device with stacked memory die in accordance with some embodiments.

FIG. 6 is a cross-sectional block diagram of an electronic system 600 in accordance with some embodiments. The system 600 includes a memory controller 602 and the packaged semiconductor memory device 100 (FIG. 1A). Alternatively, the system 600 includes the packaged semiconductor memory device 130 (FIG. 1B) or 150 (FIG. 1C), or another packaged semiconductor device with stacked memory die. While the memory controller 602 is shown as a stand-alone chip, in some embodiments the memory controller 602 is part of a larger integrated circuit (e.g., a processor).

The packaged semiconductor memory device 100 and memory controller 602 are mounted on a printer circuit board (PCB) 608. Pins 106 connect the device 100 to the PCB 608 and pins 604 connect the memory controller 602 to the PCB 608. Traces and vias 606 in the PCB 608 couple the memory controller 602 to the packaged semiconductor memory device 100. The memory controller 602 transmits C/A signals (e.g., row access command signals, column access command signals, and write command signals) through respective traces and vias 606 to the packaged semiconductor memory device 100. For write operations, the memory controller 602 also transmits serial write data (and, in some embodiments, a data strobe signal) through respective traces and vias 606 to the packaged semiconductor memory device 100. In response to column access commands (e.g., RD1 and RD2, FIG. 3A), the packaged semiconductor memory device 100 transmits serial data (e.g., aggregated data 328, FIG. 3B, such as D1[7:0] and D2[7:0], FIG. 3A) to the memory controller 602.

Figure 7A:
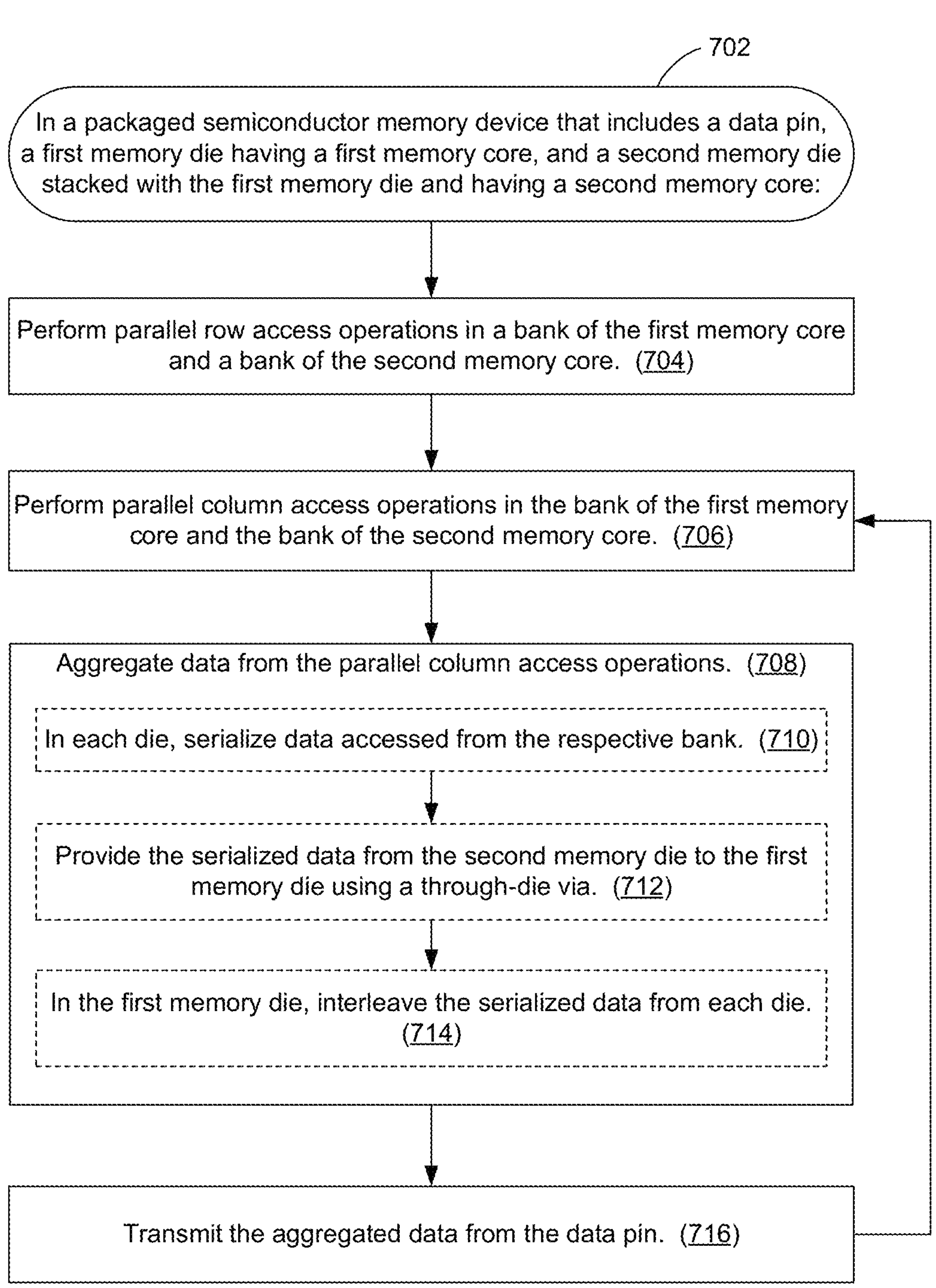
FIG. 7A is a flow diagram illustrating a method of operating a packaged semiconductor memory device in which data is read from the device, in accordance with some embodiments.

FIG. 7A is a flow diagram illustrating a method 700 of operating a packaged semiconductor memory device (e.g., device 100 or 130, FIGS. 1A-1B) in which data is read from the device, in accordance with some embodiments. The packaged semiconductor memory device includes (702) a data pin, a first memory die (e.g., master die 200*a*, FIGS. 2A-2B) having a first memory core (e.g., core 202*a*, FIGS. 2A-2B), and a second memory die (e.g. slave die 200*b*, FIGS. 2A-2B) stacked with the first memory die and having a second memory core (e.g., core 202*b*, FIGS. 2A-2B).

Row access operations are performed (704) in parallel in a bank of the first memory core and a bank of the second memory core. For example, row access operations are performed in parallel in banks 204*a*-*n* and 204*b*-*n* (FIG. 2B) in response to a single row access command signal (e.g., the ACT command signal, FIG. 3A).

Column access operations are performed (706) in parallel in the bank of the first memory core and the bank of the second memory core. For example, column access operations are performed in parallel in banks 204*a*-*n* and 204*b*-*n* (FIG. 2B) in response to a single column access command signal (e.g., the RD1 command signal, FIG. 3A).

Data from the parallel column access operations is aggregated (708). In some embodiments, data accessed from the respective banks is serialized (710) in each die (e.g., by serializers 404*a* and 404*b*, FIGS. 4A-4B). The serialized data from the second memory die is provided (712) to the first memory die using a through-die via (e.g., through-die via 218, FIGS. 2A-2B and 4A-4B). The serialized data from each die is interleaved (714) in the first memory die (e.g., resulting in aggregated data stream 328, FIG. 3A, such as serial data stream D1[7:0], FIG. 3B).

In some embodiments, a clock signal is provided from the first memory die to the second memory die using a through-die via (e.g., through-die via 216, FIGS. 2A-2B and 4A-4B). To provide (712) the serialized data from the second memory die to the first memory die, respective bits of the serialized data from the second memory die are transmitted to the first memory die during respective portions (e.g., portion 332, FIG. 3B) of the clock signal's cycle but not during other portions (e.g., portion 330, FIG. 3B) of the cycle.

The aggregated data is transmitted (716) from the data pin. In some embodiments, the data rate at which data in each die is serialized in operation 710 is a fraction of the data rate at which the aggregated data is transmitted in operation 716. For example, the data rate at which data in each die is serialized in operation 710 is half the data rate at which the aggregated data is transmitted in operation 716.

In some embodiments, a series of parallel column access operations is performed in the bank of the first memory core and the bank of the second memory core in response to a series of column access commands (e.g., in response to successive commands RD1 and RD2, FIG. 3A). Data from the series of parallel column access operations is aggregated and the aggregated data is transmitted via the data pin.

In some embodiments, the packaged semiconductor memory device (e.g., device 150, FIG. 1C) further includes a plurality of additional memory die stacked with the first and second memory die, each of which includes a memory core having a plurality of banks. Row access operations are performed in respective banks of the additional memory die, in parallel with the row access operations (704) in the first and second memory cores. Column access operations are then performed in the respective banks of the additional memory die, in parallel with the column access operations (706) in the first and second memory cores. In each memory die, the data accessed in the column access operations is serialized; the serialized data from the second memory die and the plurality of additional memory die is provided to the first memory die using a through-die via. The serialized data from each memory die is aggregated (e.g., interleaved) and transmitted (716) from the data pin. In some embodiments, the aggregated data is transmitted at a data rate equal to the data rate of the serialized data from each memory die multiplied by the number of memory die.

Figure 7B:
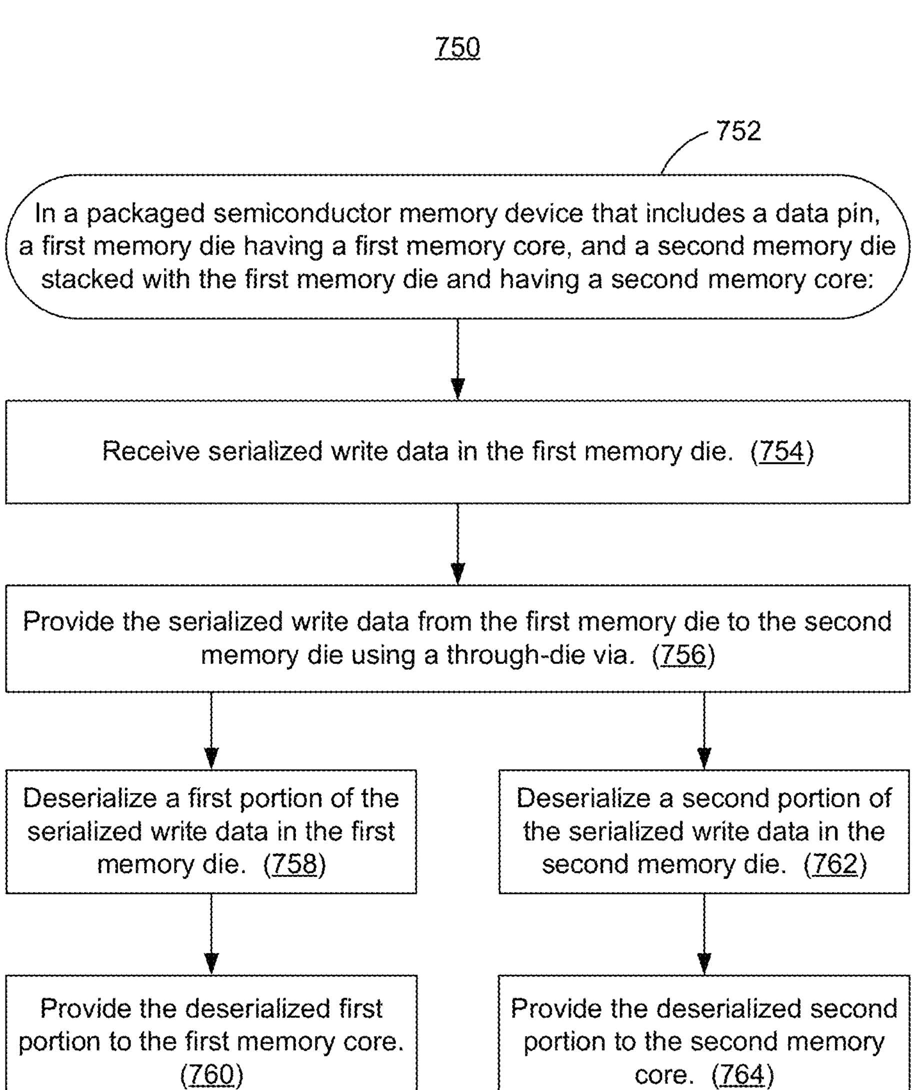
FIG. 7B is a flow diagram illustrating a method of operating a packaged semiconductor memory device in which data is written to the device, in accordance with some embodiments.

FIG. 7B is a flow diagram illustrating a method 750 of operating a packaged semiconductor memory device (e.g., device 100 or 130, FIGS. 1A-1B) in which data is written to the device, in accordance with some embodiments. The packaged semiconductor memory device includes (752) a data pin, a first memory die (e.g., master die 200*a*, FIGS. 2A-2B) having a first memory core (e.g., core 202*a*, FIGS. 2A-2B), and a second memory die (e.g., slave die 200*b*, FIGS. 2A-2B) stacked with the first memory die and having a second memory core (e.g., core 202*b*, FIGS. 2A-2B).

Serialized write data is received (754) in the first memory die from the data pin.

The serialized write data is provided (756) from the first memory die to the second memory die using a through-die via (e.g., through-die via 220, FIGS. 2A-2B and 5A-5B). In some embodiments, a data strobe is provided from the first memory die to the second memory die using a through-die via (e.g., through-die via 222, FIGS. 2A-2B and 5A-5B). For example, flip-flops 512*a* and 512*b* (FIGS. 5A-5B) using the data strobe to receive the respective first and second portions of the serialized write data.

A first portion of the serialized write data is deserialized (758) in the first memory die (e.g., by deserializer 514*a*, FIGS. 5A-5B). The deserialized first portion is provided (760) to the first memory core. A second portion of the serialized write data is deserialized (762) in the second memory die (e.g., by deserializer 514*b*, FIGS. 5A-5B). The deserialized second portion is provided (764) to the second memory core.

The methods 700 (FIG. 7A) and 750 (FIG. 7B) thus allow for data to be read from and written to stacked memory die coupled by through-die vias. While the methods 700 (FIG. 7A) and/or 750 (FIG. 7B) include a number of operations that appear to occur in a specific order, it should be apparent that the methods 700 (FIG. 7A) and/or 750 (FIG. 7B) can include more or fewer operations, which can be executed serially or in parallel. Two or more operations may be combined into a single operation.

The circuitry of FIGS. 2A-2B, 4A-4B, and 5A-5B provides an efficient way of coupling two or more memory die with through-die vias. Because data fetched from the cores in the method 700 (FIG. 7A) is serialized in each die before being aggregated, a single through-die via 218 is used to transmit data from the slave die to the master die in each instance of a read path 400 (FIGS. 4A-4B). Similarly, because write data is deserialized in each die and the write data provided from the master die to the slave die is therefore serialized (e.g., as in the method 750, FIG. 7B), two through-die vias 220 and 222 are used to transmit write data and the data strobe from the master die to the slave die in each instance of a write path 500 (FIGS. 5A-5B).

Also, aggregating data from each die in the stack allows the column-data-width and the page size of each die in the stack to be reduced. For example, when two die 200*a* and 200*b* are stacked as shown in FIGS. 2A-2B, the column-data-width of each die is half the size it would otherwise be (e.g., each die fetches four bits instead of eight bits during a column access operation). The reduced column-data-width reduces die area. The reduced page size reduces power supply noise, IR drops, and internal voltage droop in the die, resulting in improved power integrity and more robust and reliable performance. In some embodiments, this improved power integrity and performance can be traded to reduce the limit on how many banks can be activated in a specified period (e.g., to reduce the four-activate window $t_{FAW}$).

The foregoing description, for purpose of explanation, has been described with reference to specific embodiments. However, the illustrative discussions above are not intended to be exhaustive or to limit all embodiments to the precise forms disclosed. Many modifications and variations are possible in view of the above teachings. The disclosed embodiments were chosen and described to best explain the underlying principles and their practical applications, to thereby enable others skilled in the art to best implement various embodiments with various modifications as are suited to the particular use contemplated.

What is claimed is:

1. A memory device, comprising:

a first memory die coupled to a data pin and including a first storage array;

a second memory die stacked with the first memory die and including a second storage array;

in response to a read command, the first storage array and the second storage array to perform parallel read access operations to access disaggregated read data;

serialization circuitry to serialize the disaggregated read data into aggregated read data; and wherein the data pin is to transmit the aggregated read data in the form of serialized read data to a memory controller.

2. The memory device according to claim 1, wherein:

the data pin transmits the serialized read data at a first data rate; and the serialization circuitry is to receive the disaggregated read data as a first read data portion and a second read data portion at a second data rate that is less than the first data rate.

3. The memory device according to claim 2, wherein:

the second data rate is half the first data rate.

4. The memory device according to claim 2, wherein:

the first read data portion and the second read data portion comprise alternating bits of the disaggregated read data.

5. The memory device according to claim 1, wherein:

the first memory die includes first interface circuitry to communicate with the second memory die over at least one through-silicon-via (TSV); and wherein the first interface circuitry, in response to the read command, accesses the second storage array over the TSV.

6. The memory device according to claim 1, wherein: the data pin is bidirectional.

7. The memory device according to claim 1, wherein: the first memory die comprises a first dynamic random access memory (DRAM) die; and; the second memory die comprises a second DRAM die.

8. A method of operation in a memory device, the memory device having a data pin, a first memory die coupled to the data pin, and a second memory die stacked with the first memory die, the method comprising:

performing parallel read access operations to the first memory die and the second memory die to access disaggregated read data in response to receiving a read command;

serializing the disaggregated read data into serialized aggregated read data; and transmitting, with the data pin, the serialized aggregated read data to a memory controller.

9. The method of claim 8, wherein:

transmitting of the serialized aggregated read data by the data pin is carried out at a first data rate; and performing parallel read access operations accesses the disaggregated read data as a first unserialized portion of the disaggregated read data and a second unserialized portion of the disaggregated read data at a second data rate that is less than the first data rate.

10. The method of claim 9, wherein: the second data rate is half the first data rate.

11. The method of claim 9, wherein: the first unserialized portion of the aggregated read data and the second unserialized portion of the aggregated read data comprise alternating bits of the disaggregated read data.

12. The method of claim 9, further comprising:

communicating, using the first memory die, with the second memory die over at least one through-silicon-via (TSV); and transferring, in response to the read command, a second portion of the disaggregated read data to the first memory die over the at least one TSV.

13. The method of claim 8, wherein: performing parallel read access operations to the first memory die and the second memory die is carried out in accordance with a dynamic random access memory (DRAM) protocol.

14. A dynamic random access memory (DRAM) device, comprising:

multiple DRAM memory die stacked in a vertical relationship, the multiple DRAM memory die having multiple storage arrays;

in response to receiving a read command, the multiple storage arrays to perform parallel read access operations to access disaggregated read data;

serialization circuitry to serialize the disaggregated read data into serialized read data; and a data pin to transmit the serialized read data to a memory controller.

15. The DRAM device according to claim 14, wherein:

the multiple DRAM memory die are formed with at least one through-silicon-via; and interface circuitry of one of the multiple DRAM memory die, in response to receiving the read command, is to access at least one of the multiple storage arrays of at least one of the other multiple DRAM memory die over the at least one TSV.

16. The DRAM device according to claim 14, wherein:

the data pin transmits the serialized read data at a first data rate; and the serialization circuitry is to receive the disaggregated read data as a first portion of the disaggregated read data and a second portion of the disaggregated read data at a second data rate that is less than the first data rate.

17. The DRAM device according to claim 16, wherein: the second data rate is half the first data rate.

18. The DRAM device according to claim 16, wherein: the first portion of the disaggregated read data and the second portion of the disaggregated read data comprise alternating bits of the disaggregated read data.

19. The DRAM device according to claim 18, wherein: the data pin is bidirectional.

20. The DRAM device according to claim 19, wherein: the serialization circuitry includes respective serialization circuits in each of the multiple DRAM memory die.

* * * * *